United States Patent
Scheuer et al.

(10) Patent No.: US 6,791,097 B2
(45) Date of Patent: Sep. 14, 2004

(54) ADJUSTABLE CONDUCTANCE LIMITING APERTURE FOR ION IMPLANTERS

(75) Inventors: Jay T. Scheuer, Rowley, MA (US); Anthony Renau, West Newbury, MA (US); Eric D. Hermanson, Tewksbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/050,743

(22) Filed: Jan. 16, 2002

(65) Prior Publication Data

US 2002/0121613 A1 Sep. 5, 2002

Related U.S. Application Data

(60) Provisional application No. 60/262,594, filed on Jan. 18, 2001.

(51) Int. Cl.[7] .................................................. H01J 37/08
(52) U.S. Cl. ............................. 250/492.21; 250/492.3; 250/309; 250/310; 118/723; 438/14; 364/550
(58) Field of Search ..................... 250/492.21, 492.3, 250/309, 310; 118/723; 438/14, 15, 800; 364/550

(56) References Cited

U.S. PATENT DOCUMENTS

| | | | |
|---|---|---|---|
| 4,066,905 A | 1/1978 | Dassler et al. | |
| 4,539,217 A | 9/1985 | Farley | |
| 4,807,994 A | 2/1989 | Felch et al. | |
| 4,899,059 A | 2/1990 | Freytsis et al. | |
| 4,922,106 A | 5/1990 | Berrian et al. | |
| 5,146,098 A | 9/1992 | Stack | |
| 5,319,212 A | 6/1994 | Tokoro | |
| 5,350,926 A | 9/1994 | White et al. | |
| 5,629,528 A | 5/1997 | Jost et al. | |
| 5,760,409 A | 6/1998 | Chen et al. | |
| 5,814,823 A | 9/1998 | Benveniste | |
| 5,883,017 A | * 3/1999 | Tepman et al. | ............. 438/800 |
| 5,998,798 A | 12/1999 | Halling et al. | |
| 6,194,734 B1 | 2/2001 | Loomis et al. | |
| 6,323,497 B1 | 11/2001 | Walther | |
| 6,528,804 B1 | * 3/2003 | Sullivan et al. | ......... 250/492.21 |

FOREIGN PATENT DOCUMENTS

| | | |
|---|---|---|
| EP | 0 964 426 A2 | 12/1999 |
| EP | 1 030 343 A2 | 8/2000 |
| JP | 05325858 A | 12/1993 |
| JP | 11339711 | 12/1999 |
| JP | 2000180599 A | 6/2000 |

OTHER PUBLICATIONS

Chu et al., "Apparatus and Method for Direct Current Plasma Immersion Ion Implantation", Pub. No. US 2001/0046566 A1, publication date: Nov. 29, 2001.*

* cited by examiner

*Primary Examiner*—John R. Lee
*Assistant Examiner*—Zia R. Hashmi

(57) ABSTRACT

A charged particle beam apparatus includes a charged particle beam source for directing a charged particle beam along a beam path in a downstream direction to a target, and a processing station that defines a target chamber. The processing station includes a chamber divider which divides the target chamber into upstream and downstream regions during charged particle beam processing of the target, the target being located in the downstream region. The divider has an aperture therethrough sized to permit passage of the ion beam to the target without substantial blockage and to limit backflow of gas into the upstream region of the chamber. The divider minimizes the beam volume which is exposed to extraneous species generated at the target and thereby reduces the probability of beam-altering collisions.

25 Claims, 3 Drawing Sheets

ADJUSTABLE CONDUCTANCE LIMITING APERTURE FOR ION IMPLANTERS

CROSS-REFERENCE TO RELATED APPLICATION

This application claims the benefit of provisional application Serial No. 60/262,594, filed Jan. 18, 2001, which is hereby incorporated by reference.

FIELD OF THE INVENTION

The present invention relates generally to the fabrication of semiconductor devices and, more particularly, to the reduction of gas flow from photoresist-coated wafers into the beamline during ion implantation.

BACKGROUND OF THE INVENTION

Ion implanters are used in the fabrication of semiconductor devices to change the characteristics of a silicon or other semiconductor wafer by implanting a layer of dopant into the wafer. The dopant is implanted using ion implanters which generate and accelerate dopant ions and direct the energetic ions to a target wafer. By controlling the energy of the dopant ions, the depth of penetration of the ions into the silicon wafer can be controlled. Common dopants include boron, phosphorous and arsenic.

In ion implanters, a source module converts dopant gas molecules into a plasma. An ion beam is extracted from the source module. After extraction, the ion beam undergoes mass analysis and acceleration. Mass analysis is achieved by magnetically selecting specified ions in the beam so that they may be used for implant. Acceleration produces an ion energy commensurate with the desired implantation depth. Following analysis and acceleration, the ion beam is directed at the target wafer within a target chamber. The ion beam may be distributed over the wafer by beam scanning, by wafer movement or by a combination of beam scanning and wafer movement. Examples of ion implanter architectures are disclosed in U.S. Pat. No. 4,922,106 issued May 1, 1999 to Berrian et al., U.S. Pat. No. 4,899,059 issued Feb. 6, 1990 to Freytsis et al. and U.S. Pat. No. 5,350,926 issued Sep. 27, 1994 to White et al.

Many wafers processed by ion implanters use photoresist as an implant mask. When the ions impinge on the photoresist, large amounts of gas, primarily hydrogen gas, can be liberated, thereby increasing the pressure in the target chamber and the beamline. The increased pressure increases the probability that ions in the beam will collide with molecules of the liberated gas and suffer charge exchange or ionizing collisions. These collisions may change the charge state, direction and energy of the ions in the beam, resulting in a degradation of the ability to accurately measure the ion current delivered to the wafer and to control the location and depth of the ion implant. For example, neutralized ions are not measured by a Faraday beam current sensor, despite the fact that these neutralized ions are implanted into the wafer and contribute to total dose.

Efforts have been made to compensate for inaccuracies in ion beam measurements resulting from beam alteration attributed to introduction of extraneous species from various sources. Such efforts rely on sensing the residual background gas, and then adjusting the ion dose according to a calibration model based upon the probability of charge altering collisions occurring under the conditions of operation. Such techniques are described, for example, in U.S. Pat. No. 4,539,217 issued Sep. 3, 1985 to Farley, U.S. Pat. No. 5,319,212 issued Jun. 7, 1994 to Tokoro, U.S. Pat. No. 5,146,098 issued Sep. 8, 1992 to Stack and U.S. Pat. No. 5,814,823 issued Sep. 29, 1998 to Benveniste. Calibration, however, is difficult and not entirely satisfactory, as the calibration model may not accurately reflect the operating conditions. An ion dosage measurement apparatus for an ion implanter is disclosed in European Patent Application No. EP 0 964 426 A2, published Dec. 15, 1999. A restriction plate having an aperture is positioned in the beamline during a calibration procedure and is moved out of the beamline during ion implantation of wafers. An ion implanter incorporating a variable aperture for adjusting the amount of ion beam current passing therethrough is disclosed in U.S. Pat. No. 6,194,734 issued Feb. 27, 2001 to Loomis et al. None of the prior art approaches have been entirely satisfactory in resolving the problems which arise when gas is liberated from photoresist-coated wafers during ion implantation.

Accordingly, there is a need for improved methods and apparatus for limiting the adverse effects of unwanted gas on ion implantation.

SUMMARY OF THE INVENTION

The present invention is directed to an ion implanter apparatus which minimizes the effects on the ion beam of extraneous gases released into the target chamber as a result of beam impingement on target wafers. In particular, the invention involves dividing the target chamber into upstream and downstream regions with a divider having an aperture therethrough for passage of the beam to the target. The aperture size is adjusted to let substantially all of the beam through but to significantly limit gas flow from the target to the upstream side of the divider. Preferably, the aperture size is adjustable for different beam configurations and is located close to the target. In this manner, the inventive apparatus minimizes the beam volume which is exposed to extraneous species and confines collisions to a part of the implanter where they do not substantially affect ion direction, energy or charge state. The invention thus reduces the probability of beam-altering collisions and enhances the ability to control the dose and depth of the ion implant.

According to one aspect of the invention, a charged particle beam apparatus is provided. The charged particle beam apparatus comprises a charged particle beam source for directing a charged particle beam along a beam path in a downstream direction to a target, and a processing station that defines a target chamber. The processing station comprises a chamber divider which divides the target chamber into upstream and downstream regions during charged particle beam processing of the target. The target is located in the downstream region, and the divider has an aperture therethrough sized to permit passage of the ion beam to the target without substantial blockage and to limit backflow of gas into the upstream region of the chamber.

Preferably, the charged particle beam apparatus further comprises an aperture adjustment mechanism for adjusting the size of the aperture. The aperture adjustment mechanism may comprise one or more movable plates and a drive mechanism for moving the plates toward or away from each other to adjust the aperture size.

According to another aspect of the invention, an ion implanter is provided. The ion implanter comprises an ion source for directing an ion beam along a beam path toward a target, a mass analyzer disposed along the beam path for selecting desired ions in the ion beam, an accelerator disposed along the beam path for accelerating the selected ions in the ion beam to desired energies, a scanner for distributing the ion beam over the target, and a processing station that defines a target chamber. The processing chamber comprises a divider which divides the target chamber into upstream and downstream regions during ion implantation of the target. The target is located within the downstream region, and the chamber divider has an aperture therethrough sized to permit passage of the ion beam to the target without substantial blockage and to limit backflow of gas into the upstream region of the chamber.

According to a further aspect of the invention, a method is provided for reducing the probability of beam-altering collisions within a target chamber of an ion implanter. The target chamber is adapted for enclosing a target having photoresist thereon. The method comprises providing a divider within the target chamber which divides the target chamber into upstream and downstream regions during ion beam processing of the target. The target is located within the downstream region, and the chamber divider has an aperture therethrough sized to permit passage of the ion beam to the target without substantial blockage and to limit backflow of gas into the upstream region of the chamber.

According to a further aspect of the invention, an ion implanter is provided for implanting ions into a semiconductor wafer. The ion implanter comprises an ion beam generator for generating an ion beam, a processing station that defines a target chamber for receiving the ion beam, the processing station including a divider for dividing the target chamber into upstream and downstream regions during ion implantation of the semiconductor wafer, the semiconductor wafer being located in the downstream region, the divider having an aperture sized to pass the ion beam without substantial blockage and to limit backflow of gas from the downstream region to the upstream region, and first and second vacuum pumps coupled to the upstream and downstream regions, respectively, of the target chamber.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
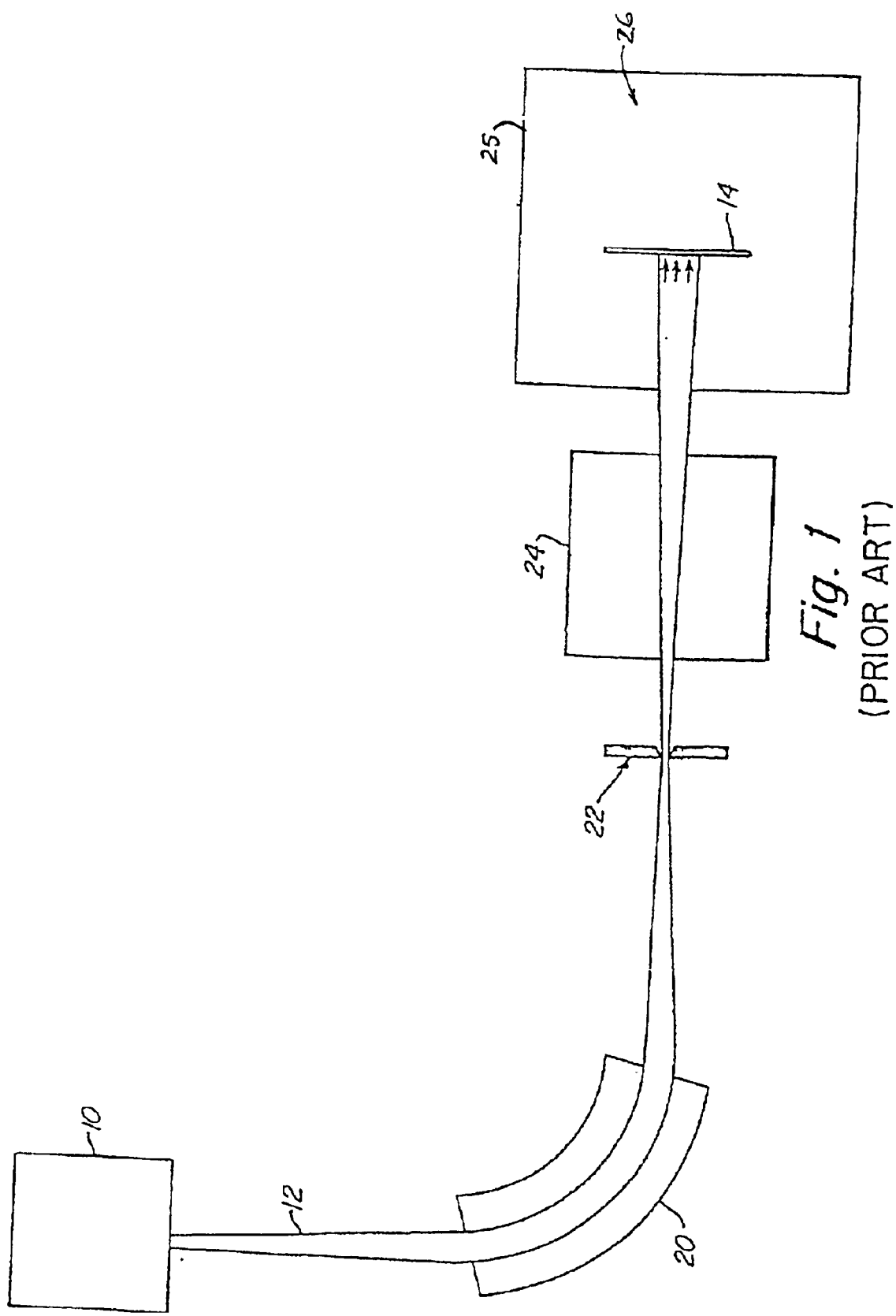
FIG. 1 is a simplified schematic block diagram of an ion implanter in accordance with the prior art.

The structure and operation of ion implanters is well known to those skilled in the art. A simplified schematic block diagram of a prior art ion implanter is shown in FIG. 1. An ion source 10 directs an ion beam 12 along a beam path toward a target 14, typically a semiconductor wafer. The ion beam 12 is deflected and focused by a mass analyzing magnet 20. The ion beam is focused in the plane of a mass resolving slit assembly 22. A variety of slit assembly configurations are known, including the rotating cylinder configuration of U.S. Pat. No. 5,629,528 and the prior slit assembly configurations described in the background thereof. The ion beam 20 is accelerated to a desired energy by an accelerator 24 and impinges on the target 14 located within a processing station 25 that defines a target chamber 26. The entire region between the ion source 10 and the target 14 is evacuated during ion implantation.

The ion beam 12 may be distributed over the surface of target 14 by mechanically scanning target 14 with respect to the beam, by scanning the ion beam with respect to the target or by a combination of beam scanning and target scanning. Single wafer ion implanters are currently preferred by semiconductor manufacturers. In one architecture, the ion beam is scanned in one direction, e.g., horizontally, and the wafer is mechanically scanned in an orthogonal direction. In another architecture, the ion beam is fixed and has the shape of a ribbon that is at least as wide as the wafer. The wafer is scanned perpendicular to the width dimension of the ribbon ion beam. In less preferred batch ion implanters, multiple wafers are mounted on a rotating disk during ion implantation. The processing station 25 may include a system for automatically loading semiconductor wafers into one or more target positions for implantation and for removing the wafers from the target chamber after ion implantation.

Figure 2:
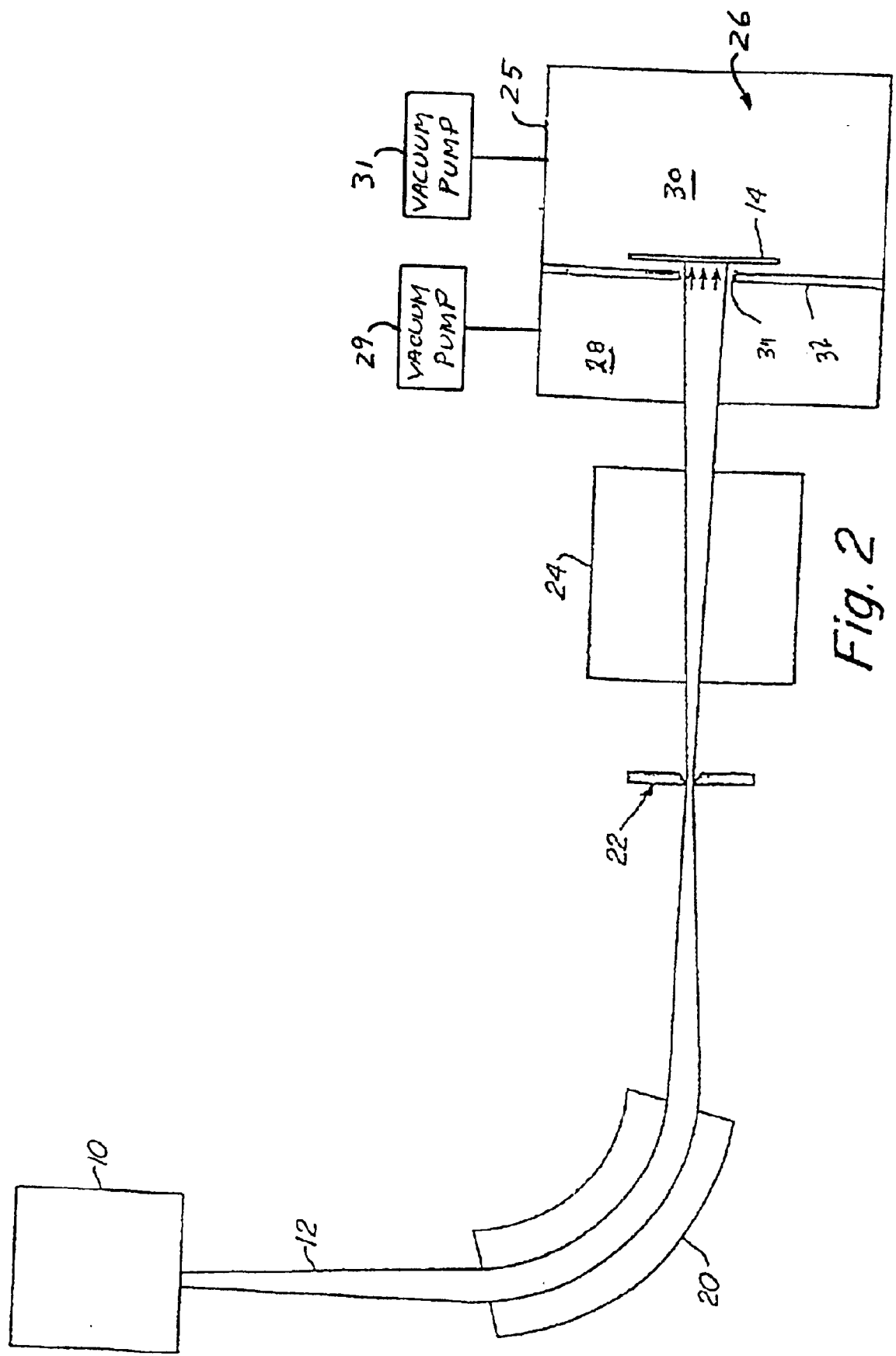
FIG. 2 is a simplified schematic block diagram of an ion implanter incorporating a divider within the target chamber in accordance with an embodiment of the present invention.

A simplified schematic block diagram of an ion implanter incorporating an embodiment of the present invention is shown in FIG. 2. Like elements in FIGS. 1 and 2 have the same reference numerals. In the embodiment of FIG. 2, processing station 25 includes a divider, such as a dividing wall 32 located adjacent to target 14, which divides the target chamber 26 into an upstream region 28 and a downstream region 30. Target 14 is located in downstream region 30. More particularly, dividing wall 32 is located between target 14 and ion source 10 and is located as close as is practical to target 14. The dividing wall 32 remains in this location during ion implantation or other processing of target 14. The dividing wall 32 is provided with an aperture 34 which is located and sized to allow the beam to pass substantially unimpeded through wall 32. Dividing wall 32 is otherwise substantially impervious to gas flow between regions 28 and 30, at least during ion implantation, thereby inhibiting backflow of gas from downstream region 30 into upstream region 28.

Preferably, the vacuum pumping system of the implanter is configured to maintain upstream region 28 at a controlled low pressure regardless of gas generation in downstream region 30. Preferably, both upstream region 28 and downstream region 30 are vacuum pumped, as described below.

Preferably, the dividing wall 32 is configured so that the final energy and angle of the ion beam are determined and the ion current is measured before the beam passes through aperture 34. That is, all beamline components are preferably upstream of dividing wall 32. Gases liberated by impingement of the beam on photoresist are thus largely confined to downstream region 30 of the target chamber 26, and within downstream region 30 the ion beam is not substantially affected by collisions with such gases. Thus, the probability of charge exchange due to collisions of beam ions with extraneous gases, and the effects of such collisions on beam angle and energy, are limited.

For most ion implanters, the configuration of the ion beam 12 is changed from time to time as different dopants and energies are required for different implant processes. To maximize the benefit of the dividing wall 32, without wasting beam ions in the process, the aperture 34 should be large enough to allow passage of the ion beam 12, but not substantially larger. Larger or smaller apertures may be utilized. However, a smaller aperture will block a portion of the ion beam and thus increase the implant time for a given dose, whereas a larger aperture will permit increased gas flow from downstream region 30 to upstream region 28. To that end, the size of aperture 34 may be made adjustable so that it may be configured optimally for each beam configuration. In the case where the beam is electronically or magnetically scanned across the target 14, the aperture 34 may be sized to accommodate the scan range of the beam.

Figure 3:
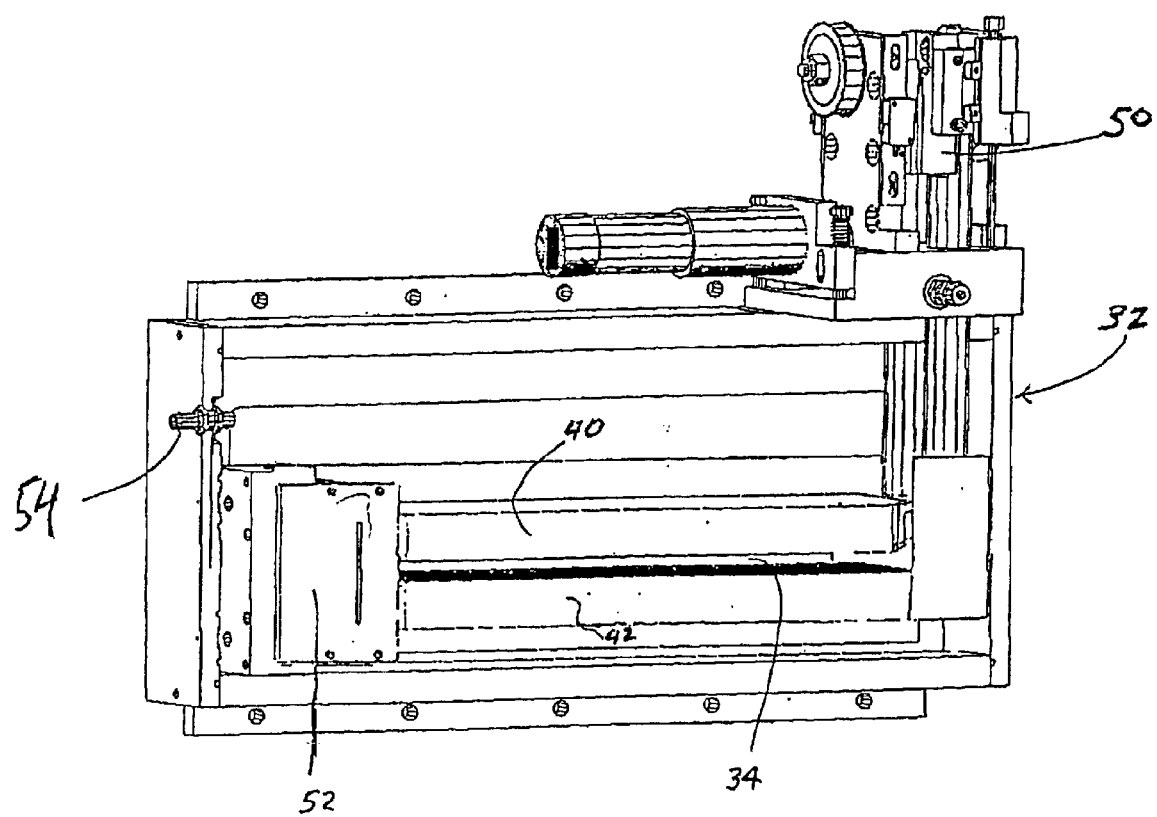
FIG. 3 is a perspective view of a target chamber divider, with an associated drive mechanism, viewed from the upstream side thereof, in accordance with an embodiment of the invention.

A preferred embodiment of dividing wall 32 is shown in FIG. 3 from the upstream side. The aperture 34 is a rectangular slit defined by the spacing between vertically movable plates 40 and 42. A drive mechanism 50 permits controlled movement of plates 40 and 42. In this way, aperture 34 can be widened or narrowed as desired. A Faraday assembly 52 permits measurement of the ion beam current before it passes through aperture 34. A pumpout port 54 permits supplemental pumping of the upstream region 28 of the target chamber.

The drive mechanism 50 may comprise conventional motor(s), controls, gearing, linkage and engagement mechanisms configured as needed to achieve the variable movements described herein. Preferably, the motor and other major components of the drive mechanism are located outside the high vacuum region, with a ferrofluidically-sealed drive cylinder or shaft communicating a controlled mechanical drive action to the plates 40 and 42.

Typically the vertically movable plates 40 and 42 are controllable to open or close in synchronism. Alternatively, independent movement of the individual plates may be provided. A single plate sliding toward a fixed plate may also be used. As an alternative to sliding plate(s), a hinged panel or panels may be rotated in a controlled manner to provide a variable aperture dimension.

In another embodiment, the aperture 34 may be adjustable in both vertical and horizontal dimensions, e.g., by providing horizontally movable end plates, not shown, which are independently movable by the drive mechanism 50, thereby permitting adjustment of the aperture length, as well as its height. Furthermore, when a non-rectangular beam configuration is utilized by the implanter, the shape of the aperture 34 and its adjustable elements may be correspondingly configured.

The dimension of the aperture 34 may be adjusted as follows. The aperture is set at maximum opening or at an opening greater than needed to allow the full ion beam 12 to impinge on the target 14. A conventional ion beam sensor, such as a Faraday cup, is used to monitor the beam impinging on the target. The ion beam sensor is located downstream of dividing wall 32. The height of the aperture 34 is then reduced by activating the drive mechanism 50 to bring plates 40 and 42 closer together until a reduction in beam current is detected by the beam sensor. If both vertical and horizontal adjustment is provided, the same technique can be used to adjust the aperture length. Alternatively, the aperture adjusting mechanism of dividing wall 32 can float electrically, with a suitable current sensor connected thereto, and the aperture can be closed until the beam is detected striking the plates 40 and 42. In some cases, the aperture size may be optimized by reopening the aperture a predetermined incremental distance after a current reduction is sensed. When the aperture dimension are determined and set, the beam is made ready for implant and wafers are processed in conventional manner.

When implementing the invention in conventional implanters, additional vacuum pumping capability may be desired in some configurations. The ion implanter may be provided with supplemental vacuum pumping of regions 28 and 30 of the target chamber 26, pumping in a manner which provides a reduced pressure in upstream region 28 relative to downstream region 30. As shown in FIG. 2, a vacuum pump 29 may be connected to upstream region 28, and a vacuum pump 31 may be connected to downstream region 30. Preferably, upstream region 28 is vacuum pumped to a pressure of about $5 \times 10^{-6}$ torr or less.

In a further embodiment of the invention, two or more variably adjustable apertures as described herein are interposed downstream of the last beamline components of the implanter and upstream of the target, each aperture being mounted in a dividing wall such that the ion beam passes through each aperture on its way to the target. The additional dividing walls further isolate gases produced at the target. Optionally, each subchamber produced by the multiple dividers may be separately vacuum pumped.

Using the invention as described herein on one commercial ion implanter has been demonstrated to reduce worst case dose shifts on 200 mm wafers from 4% to 1% without loss of throughput or degradation in uniformity.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to be specific embodiments described herein which equivalents are also intended to be encompassed by the claims attached hereto. Further, the particular features presented in the independent claims below can be combined with each other in other manners within the scope of the invention such that the invention should be recognized as also specifically directed to other embodiments having any other possible combination of the features of the dependent claims.

What is claimed is:

1. A charged particle beam apparatus comprising:
   a charged particle beam source for directing a charged particle beam along a beam path in a down stream direction to a target;
   a processing station that defines a target chamber;
   a chamber divider which divides the target chamber into upstream and downstream regions curing charged particle beam processing of the target, the target being located in the downstream region; and
   an aperture formed in the chamber divider and sized and positioned along the beam path to permit passage of the charged particle beam to the target without substantial blockage and to limit backflow of gas into the upstream region of the chamber.

2. A charged particle beam apparatus as defined in claim 1 further comprising an aperture adjustment mechanism for adjusting the size of said aperture.

3. A charged particle beam apparatus as defined in claim 2 wherein said aperture adjustment mechanism comprises one or more movable plates.

4. A charged particle beam apparatus as defined in claim 3 wherein said aperture adjustment mechanism comprises a pair of plates defining opposite sides of said aperture and movable toward and away from each other.

5. A charged particle beam apparatus as defined in claim 4 wherein said aperture adjustment mechanism further comprises a drive mechanism for moving said plates toward or away from each other to adjust the aperture size.

6. A charged particle beam apparatus as defined in claim 5 further comprising a beam sensor configured to produce a signal indicative of beam impingement on said plates, wherein said drive mechanism is responsive to said signal to adjust the aperture size to the beam size.

7. A charged particle beam apparatus as defined in claim 2 wherein said aperture adjustment mechanism comprises one or more rotatable panels.

8. A charged particle beam apparatus as defined in claim 2 further comprising a beam sensor configured to produce a signal indicative of beam size, wherein the aperture adjustment mechanism is responsive to said signal to adjust the aperture size to the beam size.

9. A charged particle beam apparatus as defined in claim 2 further comprising a beam sensor located downstream of the chamber divider to produce a signal indicative of beam current passing through said aperture, wherein the aperture adjustment mechanism is responsive to said signal to adjust the aperture size until a reduction in beam current is detected.

10. A charged particle beam apparatus as defined in claim 1 further comprising a vacuum pump for maintaining pressure within the upstream region of the target chamber at $5 \times 10^{-6}$ torr or less during operation.

11. A charged particle beam apparatus as defined in claim 1 wherein said divider is located within said target chamber such that all beamline components are upstream of the divider.

12. A charged particle beam apparatus as defined in claim 11 further comprising a beam current sensor within the upstream region of the target chamber.

13. A charged particle beam apparatus as defined in claim 1 comprising two or more dividers disposed successively in the chamber, each having an aperture.

14. A charged particle beam apparatus as defined in claim 13 wherein the size of each aperture is adjustable by an aperture adjustment mechanism.

15. A charged particle beam apparatus as defined in claim 13 wherein each divider has an associated vacuum pump for maintaining vacuum within the region of the chamber immediately upstream thereof.

16. An ion implanter comprising:
   an ion source for directing an ion beam along a beam path toward a target;
   a mass analyzer disposed along said beam path for selecting desired ions in said ion beam;
   an accelerator disposed along said beam path for accelerating the selected ions in said ion beam to desired energies;
   a scanner for distributing the ion beam over the target;
   a processing station that defines a target chamber;
   a divider which divides the target chamber into upstream and downstream regions during ion implantation of the target, the target being located within the downstream region; and
   an aperture formed in the divider and sized and positioned along the beam path to permit passage of the ion beam to the target without substantial blockage and to limit backflow of gas into the upstream region of the chamber.

17. An ion implanter as defined in claim 16 wherein said processing station further comprises an aperture adjustment mechanism for adjusting the size of said aperture.

18. An ion implanter as defined in claim 17 wherein said aperture adjustment mechanism comprises one or more movable plates.

19. An ion implanter as defined in claim 16 further comprising a first vacuum pump coupled to the upstream region of the target chamber and a second vacuum pump coupled to the downstream region of the target chamber.

20. A method for reducing the probability of beam-altering collisions between an ion beam and a gas within a target chamber of an ion implanter, the target chamber being adapted for enclosing a target having photoresist thereon, the method comprising:
   directing the ion beam along a beam path toward the target;
   providing a divider within the target chamber which divides the target chamber into upstream and downstream regions during ion beam processing of the target, the target being located within the downstream region; and
   passing the ion beam through an aperture formed in the divider and sized and positioned along the beam path to permit passage of the ion beam to the target without substantial blockage and to limit backflow of gas into the upstream region of the chamber.

21. A method as defined in claim 20 wherein the beam path configuration is adjustable and the divider aperture size is adjusted to the size of the beam path as the beam path configuration is adjusted.

22. A method as defined in claim 20 wherein the chamber divider is located such that the final energy of the beam is determined and the ion current is measured before the beam passes through said aperture.

23. An ion implanter for implanting ions into a semiconductor wafer, comprising:
   an ion beam generator for generating an ion beam along a beam path;
   a processing station that defines a target chamber for receiving the ion beam;
   a divider for dividing the target chamber into upstream and downstream regions during ion implantation of the semiconductor wafer, the semiconductor wafer being located in the down stream region;
   an aperture formed in the divider and sized and positioned along the beam path to pass the ion beam without substantial blockage and to limit backflow of gas from the downstream region to the upstream region; and
   first and second vacuum pumps coupled to the upstream and downstream regions, respectively, of the target chamber.

24. An ion implanter as defined in claim 23 wherein said processing station further comprises an aperture adjustment mechanism for adjusting the size of said aperture.

25. An ion implanter as defined in claim 24 wherein said aperture adjustment mechanism comprises one or more movable plates.

* * * * *